United States Patent
De Zwart et al.

(10) Patent No.: US 8,192,657 B2
(45) Date of Patent: Jun. 5, 2012

(54) PRODUCT WITH INTERNAL CAVITIES, AND METHOD, SYSTEM AND MOULD FOR MANUFACTURING SUCH A PRODUCT

(75) Inventors: Renatus Marius De Zwart, Eindhoven (NL); Joseph Mathias Gerardus Kunen, Schiedam (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 0 days.

(21) Appl. No.: 12/515,925

(22) PCT Filed: Nov. 22, 2007

(86) PCT No.: PCT/NL2007/050583
§ 371 (c)(1),
(2), (4) Date: Aug. 3, 2009

(87) PCT Pub. No.: WO2008/063063
PCT Pub. Date: May 29, 2008

(65) Prior Publication Data
US 2010/0028648 A1     Feb. 4, 2010

(30) Foreign Application Priority Data

Nov. 22, 2006 (EP) .................................. 06077073
Dec. 22, 2006 (EP) .................................. 06077306
Mar. 19, 2007 (EP) .................................. 07104422

(51) Int. Cl.
B29C 45/78 (2006.01)

(52) U.S. Cl. ....... 264/40.6; 264/519; 264/520; 264/522; 264/570

(58) Field of Classification Search .................... None
See application file for complete search history.

(56) References Cited

U.S. PATENT DOCUMENTS
3,733,161 A    5/1973  Nussbaum
(Continued)

FOREIGN PATENT DOCUMENTS
DE    10 2004 025 704 A1    12/2005
WO    WO 02/057061 A2    7/2002
WO    WO 2006/061089 A1    6/2006

OTHER PUBLICATIONS

Lai et al., "Resin-Gas Injection Technique for Bonding and Surface Modification of Polymer-Based Microfluidic Platforms," ANTEC 2002 Plastics: Annual Technical Conference, vol. 3, pp. 1-5, (Aug. 19, 2005).

(Continued)

*Primary Examiner* — Monica A Huson
(74) *Attorney, Agent, or Firm* — Leydig, Voit & Mayer, Ltd.

(57) ABSTRACT

Method and system for making a product (1) having a solid body (2) and having one or more cavities (3, 15) inside that solid body, with a broad surface and a small thickness. A liquid material is provided within a mold (4), and solidification of the liquid material is controlled in a position dependent way from the outside of the product. When using a thermoplastic material, the system may cool said liquid material less in areas that are projections of the cavities on the outside of the product on its broad surface. When using a thermosetting material the system may include means (5, 9) for controlled heating the liquid material, excluding the projections of the intended cavities. Once part of the product has sufficiently solidified outside the intended cavities the liquid material is driven from the intended cavities by means of a fluid. In the product some cavities may be provided with a conductive layer or structure, e.g. applied upon the surface of the relevant cavity, in/on a foam structure (18) or upon the surface of an auxiliary carrier (20) within the relevant cavity.

27 Claims, 6 Drawing Sheets

U.S. PATENT DOCUMENTS

| | | | |
|---|---|---|---|
| 5,260,014 A * | 11/1993 | Holton et al. | 264/134 |
| 5,909,012 A | 6/1999 | Todd et al. | |
| 6,367,503 B1 | 4/2002 | Keller et al. | |
| 7,122,093 B1 | 10/2006 | Lee et al. | |
| 2004/0055655 A1 | 3/2004 | Beebe | |
| 2004/0077771 A1 * | 4/2004 | Wadahara et al. | 524/495 |
| 2004/0084811 A1 | 5/2004 | Beebe et al. | |
| 2006/0008629 A1 | 1/2006 | Yusa et al. | |
| 2006/0138079 A1 | 6/2006 | Potyrailo et al. | |

OTHER PUBLICATIONS

Boehm et al., "Fundamental Processing Characteristics in Polymer Micro/Nano Molding," ANTEC 2006 Plastics: Annual Technical Conference Proceedings, pp. 2546-2550, (Nov. 3, 2006).

International Search Report for PCT/NL2007/050583, dated Feb. 21, 2008.

* cited by examiner

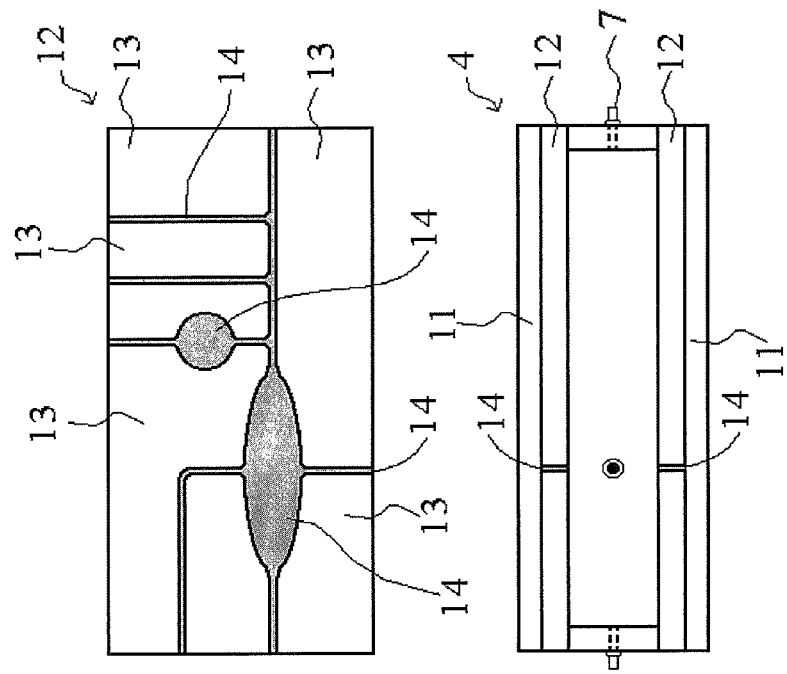
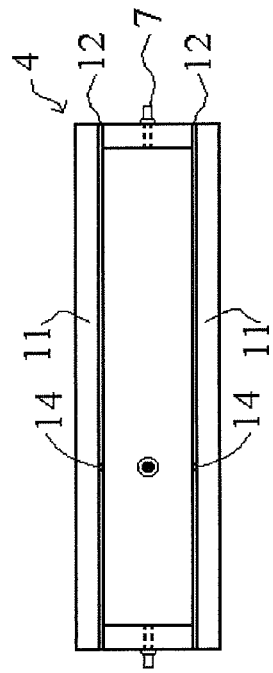
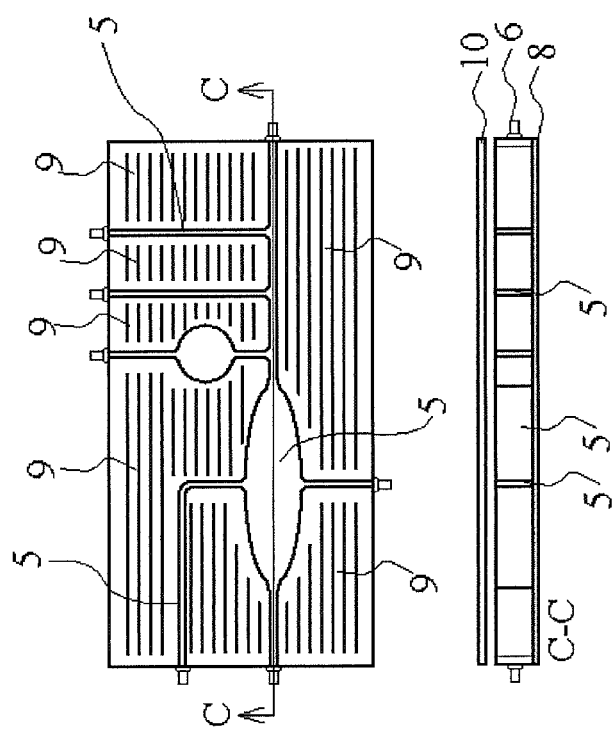
FIG. 3
FIG. 4
FIG. 5

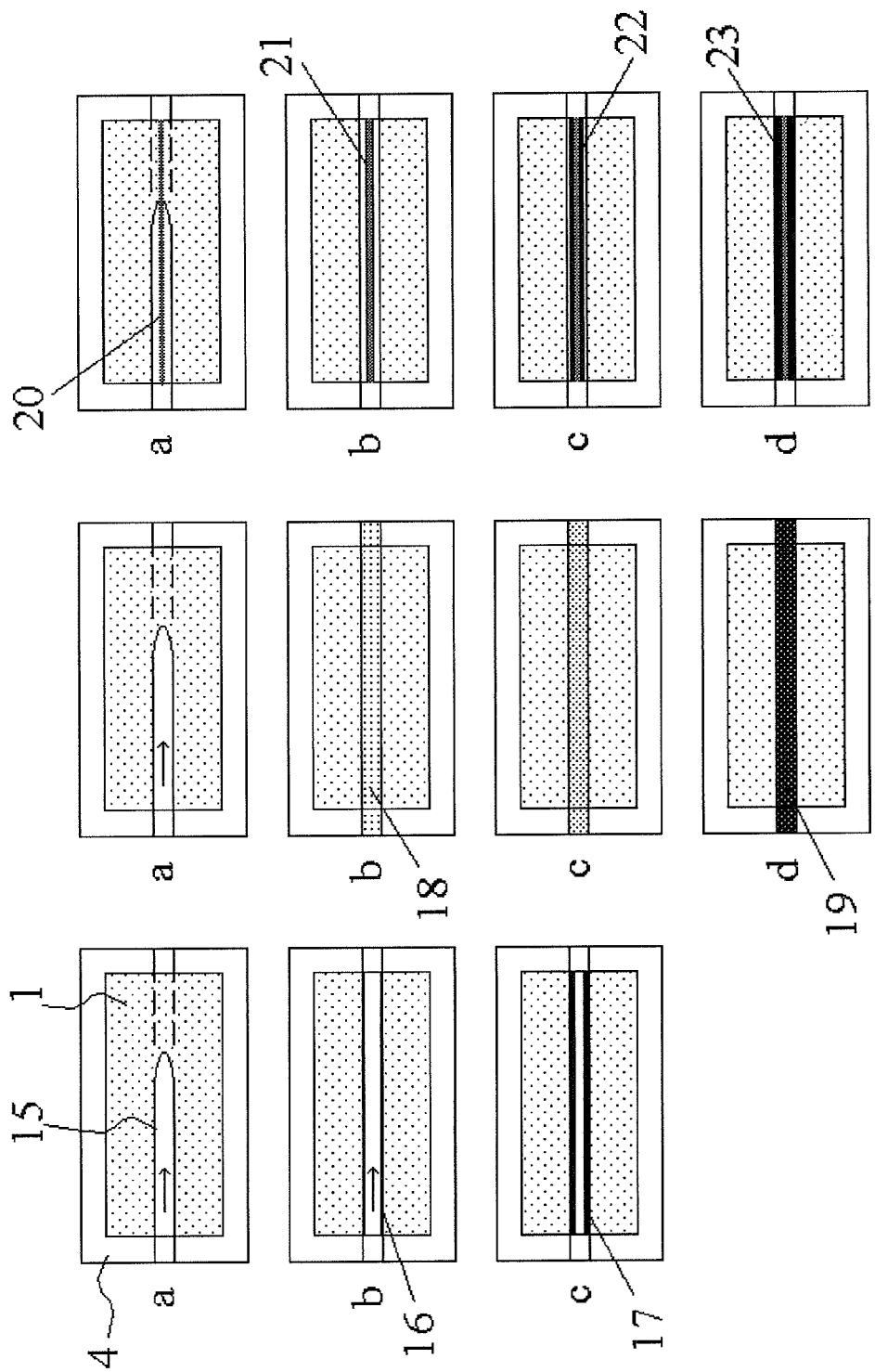

PRODUCT WITH INTERNAL CAVITIES, AND METHOD, SYSTEM AND MOULD FOR MANUFACTURING SUCH A PRODUCT

FIELD OF THE INVENTION

The invention relates to products which have a body and one or more cavities, i.e. rooms, inside the body. The products may be microfluidic or microgaseous components. In this case the cavities may include process rooms or chambers etc., inlet, outlet or connection conduits etc. within said body. Moreover, the invention may relate to products in which at least part of the cavities contain electrical conductors, thus providing e.g. a wiring structure which is supported by said body. Both, conduits, chambers etc. for liquids and/or gases, and "conduits for electricity" (normally called electric conductors) may or may not be included within the same product.

BACKGROUND

Microfluidic devices include "Lab on a chip" devices. "Lab-on-a-chip" (LOC) devices is a term in use for devices that integrate (multiple) laboratory functions on a single chip of only square millimeters to a few square centimeters in size and that are capable of handling extremely small fluid volumes down to less than pico liters. Lab-on-a-chip devices are a subset of MEMS devices and often indicated by "Micro Total Analysis Systems" (μTAS) as well. Microfluidics is a broader term that describes also mechanical flow control devices like pumps and valves or sensors like flowmeters and viscometers. However, strictly regarded "Lab-on-a-Chip" indicates generally the scaling of single or multiple lab processes down to chip-format, whereas "μTAS" is dedicated to the integration of the total sequence of lab processes to perform chemical analysis. The term "Lab-on-a-Chip" was introduced later on when it turned out that μTAS technologies were more widely applicable than only for analysis purposes.

One specific problem concerns the manufacture of conduits and/or processing or reaction chambers within the "chips", which hereinafter will be indicated as (processing) modules as well. Prior art processing modules may be made of a thermoplastic or a thermosetting synthetic resin in which conduits and reaction chambers are made from the upper and/or lower side, e.g. by means of moulding or by means of machining, after which the conduits and chambers are closed by means of a cover layer which e.g. is sealed, bonded or laser-welded to the reaction module, thus forming interior conduits and chambers. This method, however may introduce a certain level of contamination in the fluidic conduits and chambers and, moreover, is more expensive. Further, as to the field of the invention, wiring structures supported by a carrier body may be in use in electronic and electromechanical gear, e.g. in vehicles (cars, trucks, airplanes etc.), machinery or other equipment. Such wiring structures often include a carrier or support body, on which or in which a plurality of isolated copper wires are mounted. Where such a wiring structure is formed by one or more synthetic carriers comprising one or more metal conductors, the manufacturing of such structure may be rather complex due to the fact that the metal conductor(s) has (have) to be made in a separate process and inserted into a mould which, subsequently, is filled with a viscous, hardenable synthetic material, which encloses—entirely of partially—the metal conductor. Besides, well-known are printed circuit boards, comprising a two-dimensional carrier, and a wiring structure on one or both sides of the carrier. Most PCBs are composed of between one and twenty-four conductive layers separated and supported by layers of insulating material (substrates) laminated (glued with heat, pressure & sometimes vacuum) together. The vast majority of printed circuit boards are made by adhering a layer of copper over the entire substrate, sometimes on both sides, (creating a "blank PCB") then removing unwanted copper after applying a temporary mask (e.g. by etching), leaving only the desired copper traces. A few PCBs are made by adding traces to the bare substrate (or a substrate with a very thin layer of copper) usually by a complex process of multiple electroplating steps. Some PCBs have trace layers inside the PCB and are called multi-layer PCBs. These are formed by bonding together separately etched thin boards.

SUMMARY

Among others it is an object to present a method for forming a product with internal cavities and/or conduits.

A method according to claim 1 is wherein speed of solidification in the product is made influenced in a position dependent way from outside the product on the surface of the mould and unsolidified material is driven out from the product to create cavities and/or conduits in the product.

When the material is a thermoplastic material which is liquid above its melting point, the material in the mould can be solidified in a controlled way by means of controlled cooling said liquid material excluding said intended cavities, below said melting point.

When the material is a thermosetting material which is liquid before curing, the material in the mould can be solidified in a controlled way by means of controlled curing said liquid material, excluding said intended cavities.

In a further embodiment for one or more cavities and/or conduits thus made, a further step may be added, comprising applying a conductive structure inside those one or more cavities and.or conduits. The result of this step is that conductors may be made inside the product by—starting from a cavity, e.g. a conduit through the product, made in accordance with the steps outlined above—applying a conductive structure inside that cavity. In this way a product is made that not only is capable for e.g. conducting and/or processing fluids etc. ("Lab-on-chip") but is also—or exclusively—capable to conduct electricity. It is noted that such conductors are located inside the product (acting as an insulating carrier), contrary to e.g. printed circuit boards etc. which have conductors located on the surface of the insulating carrier).

BRIEF DESCRIPTION OF THE DRAWING

Below exemplary embodiments will be described using the following figures.

FIG. 3 shows a detail of the configuration shown in FIG. 2;

FIG. 4 shows an alternative way of controlled and selective energy supply for the selective conversion of a liquid into a solid mass;

FIG. 5 shows an alternative for the embodiment of FIG. 4;

FIG. 9 illustrates very schematically the main steps for making an electrical conductor according a first option;

FIG. 10 illustrates very schematically the main steps for making an electrical conductor according a second option;

FIG. 11 illustrates very schematically the main steps for making an electrical conductor according a third option.

BACKGROUND TO A LABORATORY ON A CHIP (LOC)

Figure 1:
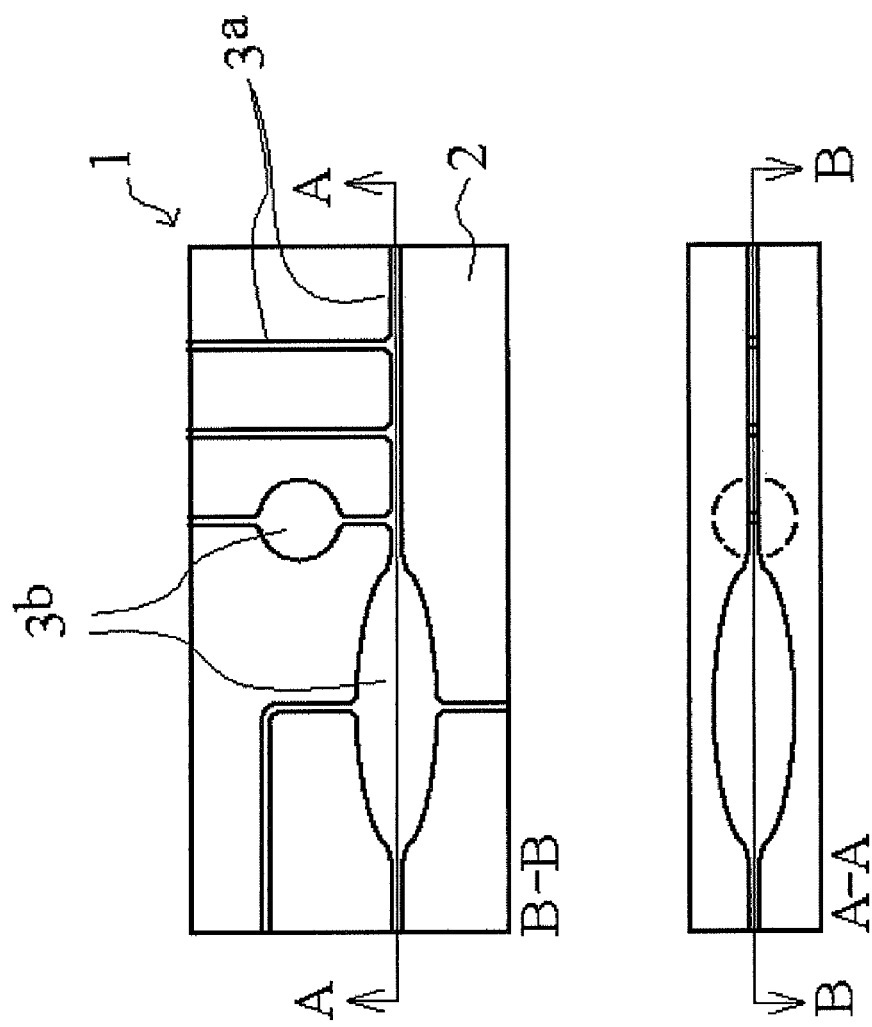
FIG. 1 shows two cross-sectional views of an example of a LOC chip or module.

Although the application of LOCs is still novel and modest, a growing interest of companies and applied research groups is observed in different fields such as analysis (e.g. chemical analysis, environmental monitoring, medical diagnostics and cellomics) but also in chemistry (e.g. rapid screening and microreactors for pharmaceutics). Besides further application developments, research in LOC systems is expected to extend towards downscaling of fluid handling structures as well, by using nanotechnology. Sub-micrometer and nano-sized conduits, DNA labyrinths, single cell detection and analysis and nano-sensors might become feasible that allow new ways of interaction with biological species and large molecules. One commercially very successful example for LOCs in life science is the development of automated patch clamp chips, that allowed for drastically increased throughput for drug screening in the pharmaceutical industry.

The basis for most LOC fabrication processes is lithography. Initially most processes were in silicon, as these well-developed technologies were directly derived from semiconductor fabrication. Because of demands for e.g. specific optical characteristics, bio- or chemical compatibility, lower production costs and faster prototyping, new processes have been developed such as glass, ceramics and metal etching, deposition and bonding, PDMS processing (e.g. soft lithography), thick-film- and stereolithography as well as fast replication methods via electroplating, injection moulding and embossing. Furthermore the LOC field more and more crosses the borders between lithography-based microsystem technology, nano technology and precision engineering.

Typical advantages of LOCs are:
low fluid volumes consumption, because of the low internal chip volumes, which is beneficial for e.g. environmental pollution (less waste), lower costs of expensive reagents and less sample fluid is used for diagnostics
higher analysis and control speed of the chip and better efficiency due to short mixing times (short diffusion distances), fast heating (short distances, high wall surface to fluid volume ratios, small heat capacities)
better process control because of a faster response of the system (e.g. thermal control for exothermic chemical reactions)
compactness of the systems, due to large integration of functionality and small volumes
massive parallelization due to compactness, which allows high-throughput analysis
lower fabrication costs, allowing cost-effective disposable chips, fabricated in mass production
safer platform for chemical, radioactive or biological studies because of large integration of functionality and low stored fluid volumes and energies Disadvantages of LOCs are:
novel technology and therefore not fully developed yet;
physical effects like capillary forces and chemical effects of conduit surfaces become more dominant and make LOC systems behave differently and sometimes more complex than conventional lab equipment;
detection principles may not always scale down in a positive way, leading to low signal to noise ratios.

FIG. 1 shows a product 1—e.g. a LOC chip—having a body 2 of solidified material and cavities 3, viz. conduits 3a and wider processing rooms 3b—inside that solid body 2.

Figure 2:
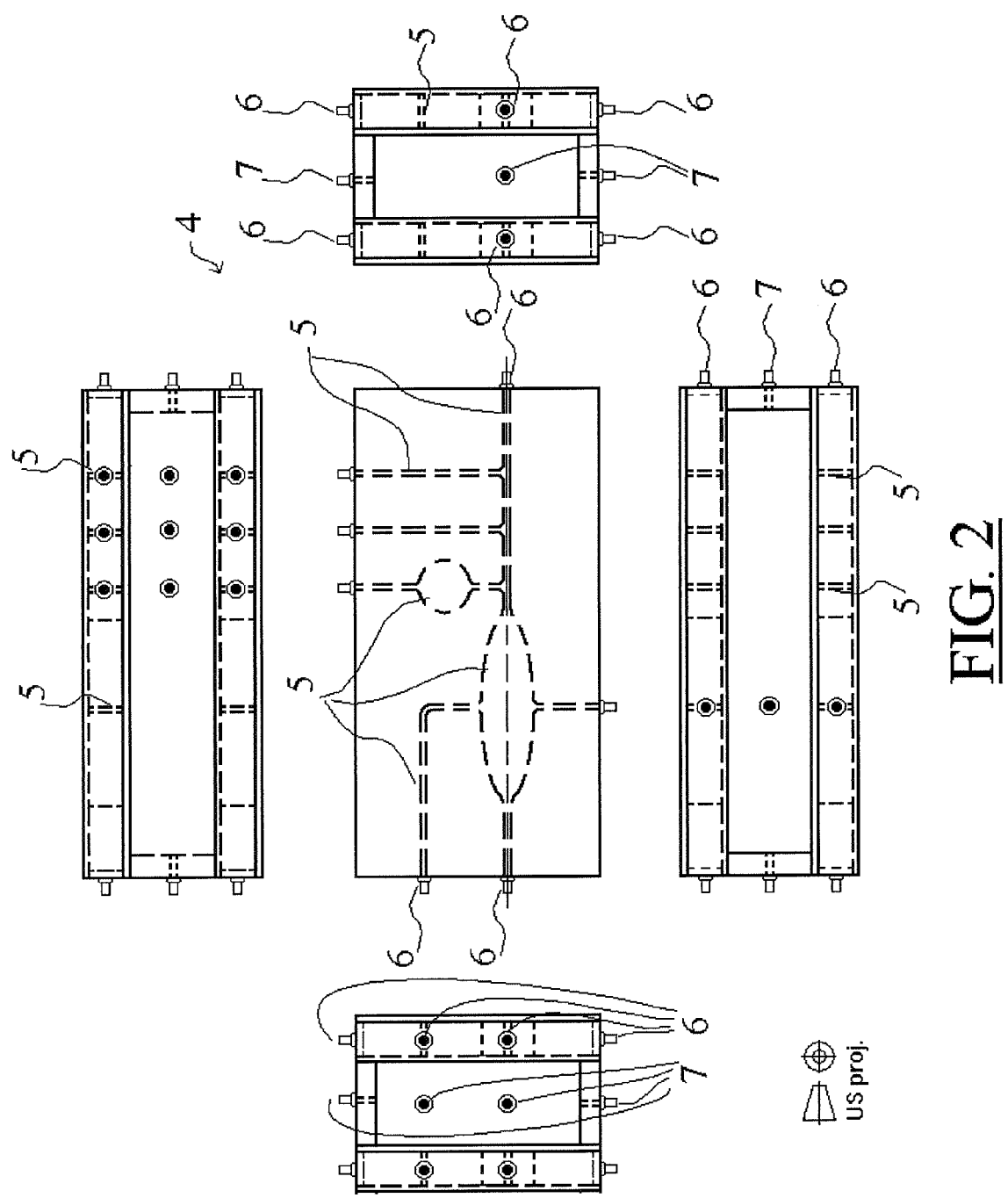
FIG. 2 shows five views of the construction of an exemplary embodiment of a configuration to produce the product shown in FIG. 1.

The product 1 is made in a mould 4, shown in FIG. 2, in which a liquid material is entered, e.g. a molten thermoplastic material (e.g. synthetic resin) or a mixture of a liquid, curable thermosetting material.

Mould 4 contains a hollow space with the outer shape of product 1. This shape need not correspond to the shape of cavities 3, conduits 3a and processing rooms 3b, inside the product. As shown in FIGS. 1 and 2 the body of the product may have the shape of a block with flat planar surfaces. The interior hollow space within mould 4 similarly may have such a block shape with flat planar surfaces. The thickness of this block is typically much less than its width and length. In an example, the thickness may be between 1-3 millimeters and its length may be over 50 millimeters. Hence, mould 4 may be box shaped. Mould 4 may have walls of uniform thickness, so that the exterior shape 4 may correspond to the shape of the interior shape, for example a box shape. FIG. 2 shows five of the walls of such a box shaped mould 4.

The production configuration, represented by the mould 4 comprises conduits 5 for controlled solidifying the synthetic material, excluding said intended cavities. Conduits 5 are arranged to provide for position dependent cooling, making changes to general mould cooling. Conduits 5 have about the same shape and trajectory as a projection onto the inner walls of mould 4 of the intended hollow conduits 3a and processing rooms 3b in the product 1 to be formed in the mould 4. Thus, the conduits 5 in mould 4 are relatively narrow over the cavities 3 in product 1, and follow their course. The conduits 5 in mould 4 are narrow over intended conduits 3a and widen over intended processing rooms 3b in product 1.

In the case of a product with considerably less thickness than length and width, the conduits 5 in mould 4 will be typically provided only in the walls of the mould that face the surface of product 1 defined by length and width of product 1, or only in one of those walls (shown as the central one of the five mould parts of FIG. 1). As the thickness of product 1 is small, the conduits 5 in this wall of mould 4 will be substantially adjacent the cavities 3 of product 1 in this case.

In operation the mould—excluding the conduits 5—is brought at a temperature which is fit to solidify the liquid material after being brought into the mould. When the product is to be made of a thermoplastic, solidification occurs by cooling the liquid material in the mould. In that case the mould 4 is cooled by a cooling system (not shown explicitly). However the solidification process is retarded in the regions of the conduits 5, viz. by means of a fluid (e.g. a thermic oil) which is pumped through those conduits 5 via conduit inlets and outlets 6 and which has a temperature which is higher than the remaining mould temperature. As the regions of the conduits 5—having the same shape as the intended conduits/rooms 3a/b in thermoplastic mass within the mould 4—thus get behind in the solidification and, moreover, the centre of the mass will always come behind the more outside regions of the mass. At a certain point in time, dependent on the actual temperature control, the condition will be reached that the outside regions of the mass inside the mould 4 and the regions which are not or less influenced by the higher temperature of the control conduits 5 have become solid, while the regions in which the solidification has been retarded under the influence of the higher temperature of the control conduits 5, and especially the inner parts thereof, are still liquid. At that time point the liquid thermoplastic material is driven out of the surrounding solidified mass by means of a driving fluid (e.g. water) or gas (e.g. air) under pressure, via inlets and outlets 7.

As may be noted inlets and outlets 7 face the mass of material in mould 4 at positions where solidification is retarded by means of conduits 5 in mould 4. No specific shape features of the product, such as outer walls in the shape of the conduits 3*a* in product 1, need to be present at these positions before driving out the mass.

Although the process is described in terms of "solidification", it should be appreciated that in fact the ability to drive out material is a matter of differences in viscosity. The driving fluid can be applied at any time when the material of the product outside the processing rooms 3*b* and conduits 3*a* has a viscosity that is higher than a certain value, at which the driving fluid is capable of driving out material, and when the material of the product inside the processing rooms 3*b* and conduits 3*a* has a viscosity that is lower than a certain maximum value, below which it is ensured that the driving fluid is capable of driving out material. Thus, the material outside the processing rooms 3*b* and conduits 3*a* need only be solidified in the sense that its viscosity prevents that the driving fluid drives out that material. As used herein "solidifying" has this meaning.

After the liquid synthetic material has been driven out, the product—from which material in hollow conduits, rooms etc. has been driven out—can finish its solidification or curing process and finally be released out of the mould.

When the product is to be made of a thermosetting material, solidification occurs by thermal curing the liquid material in the mould. In that case the mould 4 is heated by a heating system (not shown explicitly) to start curing of the thermosetting material. However the solidification (viz. curing) process is retarded in the regions of the conduits 5, viz. by means of a fluid (e.g. a thermic oil) which is pumped through those conduits 5 via conduit inlets and outlets 6 and which has a temperature which is—in this case—lower than the remaining mould temperature. As the regions of the conduits 5—having about the same shape as the intended conduits/rooms 3*a/b* in the thermosetting mass within the mould 4—thus get behind in the curing and, moreover, the centre of the mass will always come behind the more outside regions of the mass, at a certain point in time, dependent on the actual temperature control, the condition will be reached that the outside regions of the mass inside the mould 4 and the regions which are not or less influenced by the lower temperature of the control conduits 5 have become solid, while the regions in which the solidification has been retarded under the influence of the lower temperature of the control conduits 5, and especially the inner parts thereof, are still liquid. At that time point the still liquid (viz. not yet polymerized) thermosetting mass is driven out of the surrounding already cured mass by means of a driving fluid (e.g. water) or gas (e.g. air) under pressure, via inlets and outlets 7.

Figure 2A:
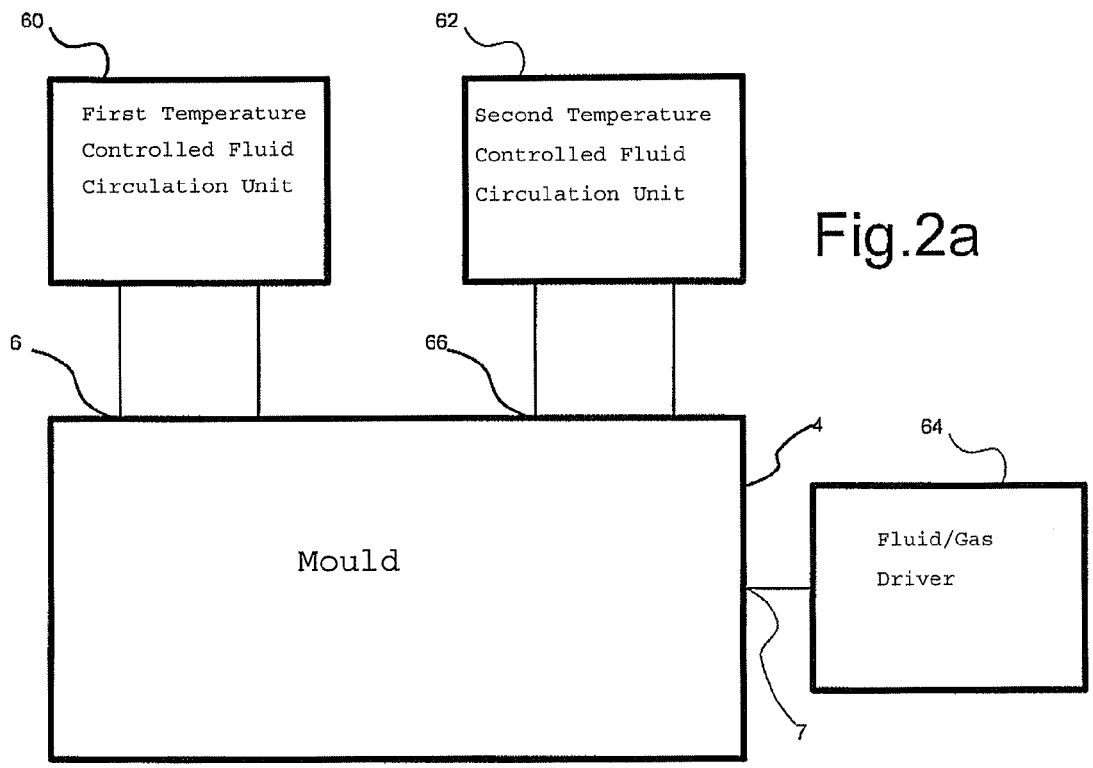
FIGS. 2a,b schematically shown an apparatus for manufacturing a product.

FIG. 2*a* schematically shows an apparatus that embodies a temperature control system for manufacturing the product in mould 4. The system comprises a first temperature controlled fluid circulation unit 60, a second temperature controlled fluid circulation unit 62 and a fluid or gas driver 64. First temperature controlled fluid circulation unit 60 is coupled to inlets and outlets 6 (only one of each shown for the sake of clarity). Second temperature controlled fluid circulation unit 62 is connected to inlets and outlets 66 of further conduits that run along areas of the inner surface of mould 4 outside the surface areas adjacent conduits 5. Fluid driver 64 is coupled to inlets 7 for the driving fluid. In operation, first temperature controlled fluid circulation unit 60, and second temperature controlled fluid circulation unit 62 circulate fluids at respectively different temperatures through mould 4. Second temperature controlled fluid circulation unit 62 regulates its fluid at a temperature that is suitable for solidifying the material from which product 1 will be formed. First temperature controlled fluid circulation unit 60 regulates its fluid at another temperature that will retard solidification of the material, compared to the fluid from second temperature controlled fluid circulation unit 62.

The material from which product 1 will be formed is introduced in mould 4 and after a selected time interval, fluid driver 64 is activated to drive out material from processing rooms 3*b* and conduits 3*a* of product 1. The time interval and the temperatures of the fluids in first and second temperature controlled fluid circulation unit may be selected experimentally. Also use may be made of computer aided simulation of the manufacturing process, to calculate the temperature distribution inside the mould as a function of time and to estimate simultaneously the possibility to drive out material only from the intended cavities 3 in product 1.

Figure 2B:
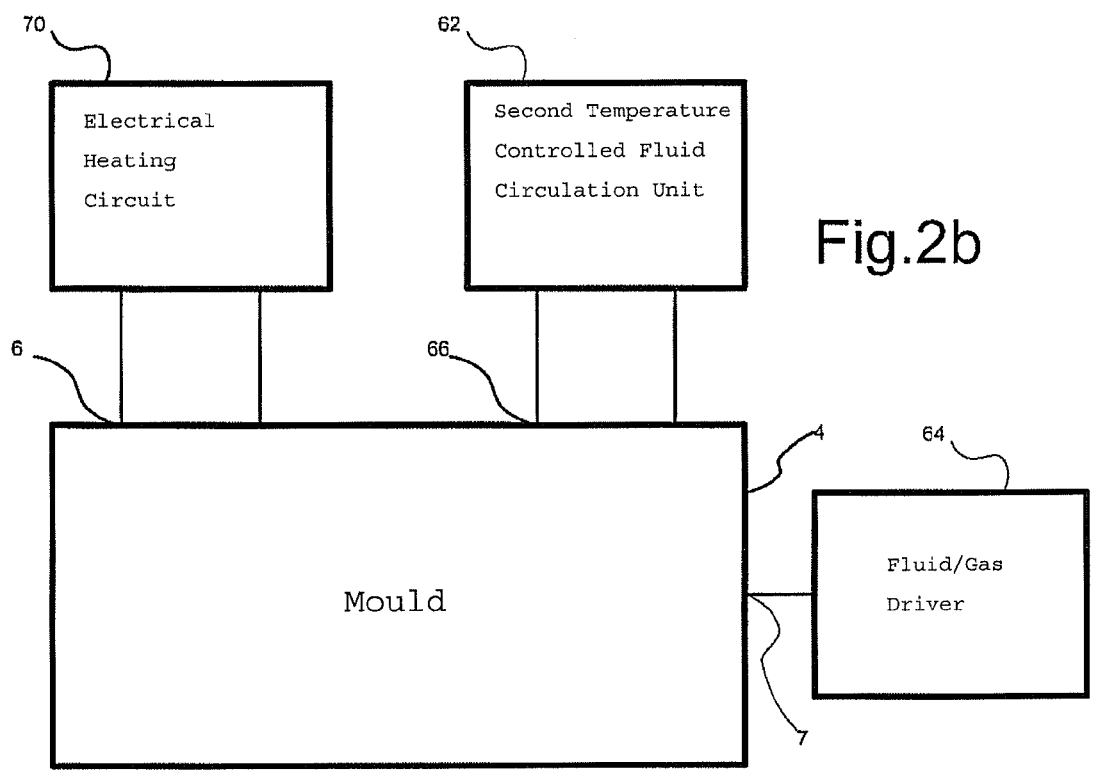

FIG. 2*b* schematically shows an apparatus for manufacturing the product in mould 4. Herein an electrical heating circuit 70 is used instead of first temperature controlled fluid circulation unit 60. Mould 4 comprises a pattern of electrically resistive material connected to electrical heating circuit 70 instead of fluid conduits. Similarly second temperature controlled fluid circulation unit may replaced by an electrical unit.

FIG. 3 shows schematically the construction of the upper and lower part of a wall of the mould 4, comprising a robust mould wall part 8 and a cover plate 10. Mould wall part 8 contains recesses in the shape of control conduits 5 which are open at one side and which e.g. are made by machining (e.g. by milling or spark erosion). In the areas between the conduits 5 the mould wall part 8 is provided with cooling or heating conduits or elements 9, which are activated to solidify or cure the material mass inside the mould 4 which has to become the solid part of the product (e.g. LOC chip), while—as explained in the preceding—the conduits 5 act to retard the solidification speed, in order to be able to discriminate and to blow out—at the right moment—the intended conduits and rooms 3 in the product 1.

After the inlets/outlets 6 are mounted to conduits 5, the half-open conduits 5 are hermetically closed and sealed by a cover plate 10.

The temperature control conduits 5 could be thermally insulated in the mould wall from the temperature control elements 9.

In the above exemplary embodiments the solidification is performed by means of controlled cooling/heating the respective areas which have to become solidified or not solidified respectively, which are embodied by means of cooling/heating conduits 5 and elements 9. FIGS. 4 and 5 show alternative configurations.

FIG. 4 shows an upper part and lower part of the mould 4 as shown in FIG. 2. In FIG. 4 the upper part and lower part both consist of a cooling element (when processing a thermoplastic mass within the mould for cooling it) or heating element (when processing a thermosetting mass within the mould for curing it) 11. Between the element 11 and the (liquid) mass inside the mould a mask 12 is provided, which comprises heat conductive parts 13 (white) and heat isolating (or less conductive) parts 14 (grey), having a shape which approximately matches with the projection of the shape of the conduits/rooms to be formed within the mass in the mould and thus within the final product to be made. Heat transfer between the mass inside the mould 4 and the elements 11, viz. to cool down the (thermoplastic) mass or to cure the (thermosetting) mass respectively is hampered by the isolation mask 14, causing local solidification delay in the areas covered by the heat isolating mask 14. Instead of the plate wise build up of the upper and lower parts in FIG. 4, the heating/cooling plate 11 and the mask member 12 may be integrated into one plate.

Alternatively, curing of thermosetting materials may be performed by means of UV or other radiation. In that case element 11 may be replaced by a UV (or other) radiating element. In that case the mask member 12 comprises parts 13 which are suitable to pass UV (or other resp.) curing radiation, while the areas 14 are not or less permeable for the curing radiation emitted by the radiating elements 11, thus hampering the solidification (viz. by curing) of the material in the areas covered by the parts 14 and causing that those area remain longer liquid, which liquid areas can be blown out by a drive gas or drive liquid (e.g. water) via the inlets/outlets 7 in the side wall of the mould, as explained more in detail in the preceding. In practice UV mask 12 may be formed by a rather thin sheet, contrary to the heat isolating masking plate 12 as illustrated in FIG. 4. FIG. 5 shows such a configuration using a thin UV mask 12, e.g. a sheet which is transparent for UV with the exception of a mask pattern (14)—as can be seen in the upper part of FIG. 4—which is not transparent for UV radiation. The UV radiation level of the radiation sources 11 may be adjustable or (e.g. dynamically) controllable.

It is noted that both, more "active" heating/cooling means like the means 5 and 9 in the configuration of FIGS. 2 and 3, and more "passive" heating/cooling means like the means 11 and 12 (incl. 13 and 14) may be used simultaneously if desired.

Concerning the blowing out process step, it may be desired to provide auxiliary conduits within the product 1 to be made, viz. to provide effective blowing out the (still) liquid mass outwards the mould (via outlets 7). Such auxiliary conduits don't have a function in the final product and may be filled or plugged before of after the product has been released out of the mould 4.

The function of the shape of conduits 5, and mask 12 is to retard solidification of the mass of material of product 1 in a position dependent way. The material near the surface of mould 4 is allowed to solidify, but the material inside the product is driven out before the material has solidified everywhere inside the product. Thus, for example when a change in temperature is used to solidify the material, the position dependent temperature of the wall of mould 4 provides for a relatively larger temperature change in product 1 outside the regions defined by conduits 5, which results in relatively faster solidification throughout product 1. In the regions defined by conduits 5, the position dependent temperature of the wall of mould 4 provides for a relatively smaller temperature change in the product. The temperature is chosen so that the product will solidify, but more slowly than outside the regions. Solidification occurs starting from the outside of product 1 and advancing inward. The material in product is driven out when solidification has moved partly inward adjacent conduits 5, leaving an interior part of product adjacent conduits 5 as yet unsolidified.

Although specific embodiments have been described, it will be appreciated that various alternatives are possible. For example, although the conduits 5 of mould are shown to have the shape of a projection of the processing rooms 3b and conduits 3a of product 1 onto the wall of mould 4, it should be appreciated that some deviation from this shape is possible. As will be recalled, the function of this shape is to allow fluid to pass through conduits 5 in mould 4 in order to retard solidification of the material of product 1 in a position dependent way, so that the material can locally be driven out from product 1.

This function can also be realized if the shape of conduits is smaller than the projection of the processing rooms 3b and conduits 3a, as the fluid circulation will retard solidification not only directly adjacent to conduits 5 but may also retard in lateral direction. For example, the diameter of conduits 5 may be reduced relative to the projection in proportion to the thickness of product 1. Of course, the diameter of conduit 5 may not be reduced to zero, which imposes a minimum thickness on thin cavities inside the product.

Furthermore, although specific examples of factors that retard solidification have been shown, it should be appreciated that other methods may be used. Instead of a method based on temperature, methods based on factors like UV irradiation intensity and/or wavelength, irradiation intensity and/or wavelengths at non-UV wavelength (e.g. infrared) or intensity of ultrasonic radiation may be used.

Instead of fluid circulation through conduits 5 in mould 4, electrical heating or cooling elements may be used, laid out in the shape proposed for conduits 5, or its complement, and/or radiators of this shape may be used to adapt temperature in product 1 by means of irradiation with electromagnetic or ultrasonic radiation. A pattern of position dependent temperature may also be "imprinted" on the mould before introducing the material of the product. When mould 4 has sufficiently high heat capacity and sufficiently small lateral heat conductivity, temperature control after introduction of the material into mould 4 may even be omitted. In this case, the imprinting could be done for example by first bringing a wall of mould 4 into thermal contact with a heat mask with position dependent temperature, the position dependence corresponding to the pattern of conduit 5, subsequently removing the wall from the heat mask and introducing the material for manufacturing product 1 into mould 4. In this case no conduit 5 needs to be provided in mould 4.

Furthermore, although conduits 5 may be present only in a wall or walls of mould 4 that face the surfaces of product 1 defined by its width and length (the width and length being greater than the thickness), it should be appreciated that conduits 5 may also be provided in walls that face product surfaces defined by thickness and length and/or by thickness and width, for example if these walls are sufficiently high and conduits are needed close to those walls. However, it is preferred to use a mould 4 in which thin products are made; products with a thickness equal to, or less than one and a half times a common value of the height of conduits 3a and processing rooms 3b in the direction of the thickness. In this case solidification can be controlled throughout the thickness (the smallest dimension) of product 1 as a function of position transverse to the thickness, from the wall or walls that face the surfaces defined by width and length. Thus the narrowest conduits 3a can be made; also it is prevented that a large volume far from the surface is not solidified in a position dependent way and subsequently driven out. In such cases no conduits 5 for selective temperature control are needed in the walls of mould 4 that face surfaces defined by thickness and width, or by thickness and length.

Furthermore, although a mould 4 with flat planar inner walls has been shown, it should be appreciated that the surface of the mould walls may have some three dimensional structure, so as to determine a non-planar outer surface structure of product 1. However, as will be appreciated, such a surface is not needed to define the inner conduits 3a and processing rooms 3b of product 1. Products with flat planar outer surfaces and inner conduits 3a and processing rooms 3b can be manufactured, which can be fit easily as modules into larger systems.

Adding Conductors

After having made a hollow conduit—or differently shaped room—inside the product, the conductive structure inside the (e.g.) conduit may be made by feeding a medium (e.g. a liquid) or a sequence of mediums through the conduit, capable to supply a desired conductive structure or at least to supply a basis for that conductive structure on the inner surface of the conduit.

The medium for driving out the (still fluid or viscous) material the mould to form a conduit, may simultaneously be used as a (first) medium for preparing (e.g. catalysing) or making a conductive layer at the conduit's inner surface.

The conductive structure inside the (e.g.) conduit may be formed by a coating upon its inside surface. Another conductive structure may be formed by first supplying an (open) foam structure inside the relevant conduits. Presuming that such foam is based on an insulating material like a plastic, the conductive structure may be made by feeding a medium or a sequence of mediums into the cavities containing such foam structure, capable to supply the desired conductive structure or at least to supply a basis for that conductive structure in that foam structure.

About the medium(s) to be used to supply the desired conductive structure or at least to supply a basis for that conductive structure in that foam structure, the following can be said.

Well known in the art as such are sequences of steps to be performed to make a conductive coating upon a surface in general, which also may be suitable for making a conductive layer upon the inside surface of e.g. a conduit through a product using the method as outlined in the preceding. This sequence of steps known as such may also be used for making a conductive layer or other structure upon the surface of the open cells of the foam which has been inserted or injected into the relevant conduits.

Next sequence may be performed thus to apply (the basis for) a conductive layer upon the inside surface of the conduit or the surface of the open foam inside the conduit, by feeding one or more mediums (viz. for etching, surface sensitization etc., see hereinafter) through the relevant cavities (e.g. conduits) in the product, which cavities are or are not filled with an open foam or a similar structure. The sequence may comprise next steps:

etching the surface to get a roughened and hydrophilic surface for good bonding properties;
surface sensitization, e.g. by adsorption of Sn ions to the surface;
surface activation, e.g. by reduction of Pd ions to metallic Pd by means of the Sn ions, resulting in a metallizing base layer or seed layer that is catalytic to the subsequent chemical metallization process;
metallizing and formation of a metal coating on the Pd seed layer by means of catalytic reduction of metal ions (e.g. Cu or Ni) from a solution that comprises both the relevant coating metal ions and a reduction chemical.

Instead of the (first three) catalysation steps a precatalysed synthetic material could be used to form the product and thus the inside surface of the conduit. When using an open foam structure inside the conduits, this structure could be made by a precatalysed synthetic material, thus avoiding the catalysation steps.

All those steps can be performed by feeding the respective mediums in e.g. liquid (or maybe gaseous) form through the conduit of synthetic material. The result of those steps is that the conduit (i.e room, conduit) has been provided with a (rather thin) metal coating inside the conduit. If it is desired to produce a wiring structure having a lower resistance, to be able to conduct relative large currents (e.g. of 100 Amps), the thin conductive metal layer inside the conduit can be thickened by means of electrolytic metallization (electroplating) using one of the methods well known by persons skilled in the art.

It may even be possible to skip the step (last step, see hereinabove) of metallizing and formation of a metal coating on the Pd seed layer and to apply electroplating directly upon the synthetic material catalysed in the (first three above) catalysation steps or provided by a precatalysed synthetic material.

Instead of—or additionally to—providing (one or more) electrical conductors within the product by supplying electrically conductive layers on the inside surface of the relevant rooms (or conduits) within the product and/or by filling the relevant cavities with an (open) foam and making that foam structure conductive as outlined above, such conductive layer could also be applied on the outer surface of a separate auxiliary conductor carrier, located within the relevant cavities.

To that end, before filling the mould with the relevant synthetic product material, for each intended conduit destined to become an electrically conducting conduit (i.e. an electrical conductor), a carrier body is inserted into the mould—or, optionally, is manufactured previously within the same mould or separately within another mould—having a shape which is essentially similar to the inner shape of the relevant intended conducting conduit. After controlled hardening the outside area of the synthetic material in the mould and supplying a pressure medium for driving out the liquid or viscous material, thus forming one or more cavities (e.g. conduits) throughout the hardened synthetic material, a conductive coating may be applied to the inside surface of the relevant conduit as well as, simultaneously, to the outside surface of the separate auxiliary carrier body, viz. by feeding the relevant (liquid of gaseous) medium(s) through the room(s)/conduit(s) made in the synthetic product. The result will be that both the inside surface of the relevant conduits and the outside surface of the auxiliary carrier (the "insert") will be provided with a metal coating inside the conduit. If desired the conductive metal layers upon the conduit and auxiliary carrier can be thickened by electroplating. Alternatively, the conduit may be made by foam injection, the open structure of which being made conductive as outlined above.

It is noted that the auxiliary insert may be made by any material, e.g. a thermoplastic or thermosetting, foamy of not-foamy synthetic material, filled or not-filled with e.g. conductive particles. It may even be made by any suitable conductive material, either metallic or not-metallic.

Figure 7:
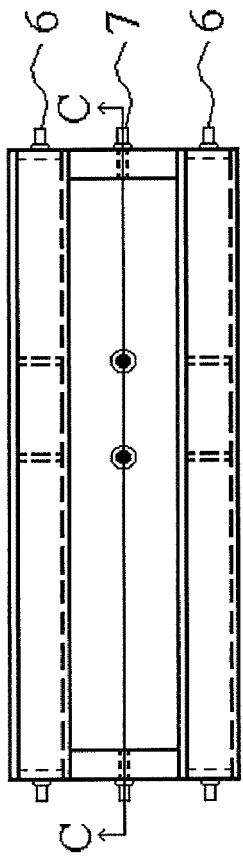
FIG. 7 shows a configuration which is arranged for making the product of FIG. 6.
Figure 8:
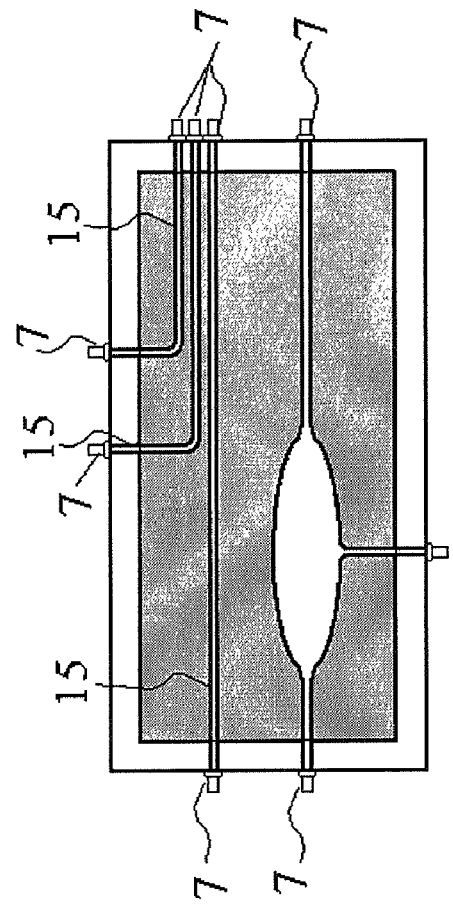
FIG. 8 shows the product of FIG. 6 inside the manufacture configuration of FIG. 7 in a cross-sectional view over the line C-C in FIG. 7.
Figure 6:
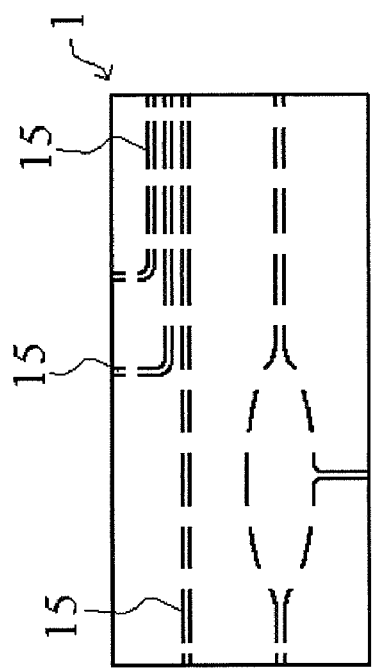
FIG. 6 shows a product which comprises internal conducting structures.

Turning now to FIGS. 6, 7 and 8. FIG. 6 shows a product which comprises inside conductors in conduits 15 that are made as outlined previously, by means of a system as shown (in US projection) in FIG. 7. FIG. 8 shows a cross-sectional view of the product of FIG. 6 inside the manufacturing configuration of FIG. 7 (over line C-C in FIG. 7).

FIG. 6 shows a product 1 made of a synthetic material, which is different from the product shown in FIG. 1. This alternative product comprises conduits 15 which are made using the method as outlined in the preceding and using a configuration which is similar to the configuration shown in FIG. 2, which is, however, adapted to make the conduits 15.

After the conduits 15 have been made in the way as outlined above, in a further step a conductive structure is applied inside the conduits 15, as the result of which a product is made that not only is capable for e.g. conducting and/or processing fluids etc. ("Lab-on-chip") but is also—or exclusively—capable to conduct electricity, viz. via conductors which are located inside the product, just like the hollow chambers and/or conduits in the product of FIG. 1.

After having made the hollow conduits 15 inside the product 1, a conductive structure may be created into the conduits 15 by feeding, via the inlets and outlets 7 of conduits 15 which were previously used to blow out the synthetic resin when it was still liquid. A (e.g. liquid) medium or a sequence of mediums thus is fed, via the inlets and outlets 7, through the conduits 15, which medium or a sequence of mediums is/are capable to supply the desired conductive structure or at least to supply a basis for that conductive structure inside the conduit.

The conductive structure inside the conduit may be formed by a coating upon its inside surface and/or by first supplying an (open) foam structure inside the conduits 15 via the inlets/outlets 7. The basis for a conductive layer upon the inside surface of the conduit or the surface of the open foam inside the conduit, is achieved by feeding relevant mediums for etching, surface sensitization etc. through the conduits 15. For example a sequence of mediums will be fed to the conduits 15:

a) a medium for etching the surface to get a roughened and hydrophilic surface for good bonding properties;
b) a medium for surface sensitization, e.g. by adsorption of Sn ions to the surface;
c) a medium for surface activation, e.g. by reduction of Pd ions to metallic Pd by means of the Sn ions, resulting in a metallizing base layer or seed layer that is catalytic to the subsequent chemical metallization process;
d) and finally a medium for metallizing and formation of a metal coating on the Pd seed layer by means of catalytic reduction of metal ions (e.g. Cu or Ni) from a solution that comprises both the relevant coating metal ions and a reduction chemical.

Instead of the (first three) catalysation steps a precatalysed synthetic material could be used to make the product or the foam. The result of the steps a through d is that the conduit 15 will contain a (rather thin) metal coating on its inside surface.

If it is desired to produce a wiring structure having a lower resistance, to be able to conduct relative large currents (e.g. of 100 Amps), the thin conductive metal layer inside the conduit can be thickened by means of electrolytic metallization (electroplating) using one of the methods well known by persons skilled in the art. The electric voltage or current can be applied by via the inlets/outlets 7, which may be adapted to connect electric wires to them, which also is deemed to be within the capabilities of each well-skilled person.

Thus, in the way as outlined above conductors inside the product 1 may be manufactured, viz. by first making conduits 15 through the product by well-controlled local heating and/or cooling the synthetic material inside the mould (see FIGS. 2 through 5) followed by applying a conductive layer inside the conduits 15 and—if desired—thicken that conductive layer e.g. by means of electroplating. Instead of or additional to making a conductive layer on the inside surface of the conduits 15, a foam may be inserted into the conduit 15, and a conductive layer may be applied on the surfaces of the (open) foam cells. Subsequently the conductive layer on the foam cell surfaces may be thickened and/or reinforced by means of e.g. electroplating. In both cases, with or without foam, the conductive layer may be thickened in such extent that the conduits 15 are filled with conductor material for a great part or even (almost) completely. Alternatively, the conduits 15 may be filled completely with any melt-processable or curable, conductive material. Conductive materials with low melt viscosity, such as low-melting metal alloys, may also be used as medium to drive out the thermoplastic or thermosetting material from the intended conduits.

As indicated in the preceding, a conductive layer could also be applied on the outer surface of an auxiliary conductor carrier which is located within the relevant conduit which is to be made conductive. In that case a carrier body is inserted into the mould or, optionally, is manufactured previously within the same mould, which carrier 20 (FIG. 11) has a shape which is essentially similar to the inner shape of the relevant intended conduit, however having a smaller diameter than it. After controlled hardening the outside area of the synthetic material in the mould and supplying a pressure medium for driving out the liquid or viscous material, thus forming one or more cavities (e.g. conduits) throughout the hardened synthetic material, a conductive coating may be applied to the outside surface of the auxiliary carrier body, viz. by feeding the relevant (liquid of gaseous) medium(s) through the conduit in which the auxiliary carrier is located. The result will be that the outside surface of the auxiliary carrier (the "insert") will be provided with a metal coating inside the conduit; additionally the internal rooms may be provided with a conductive layer too. If desired the conductive metal layers upon the conduit and auxiliary carrier can be thickened by electroplating which may result in filling almost the whole conduit with conductive material, which is illustrated in FIG. 11d. The auxiliary carrier may be made of a thermoplastic or thermosetting, foamy of not-foamy synthetic material, filled or not-filled with e.g. conductive particles or of a suitable conductive material, either metallic or not-metallic.

FIGS. 9a-c illustrate very schematically the main steps for making an electrical conductor upon the inside surface of conduit 15 through product 1. In step 9a a medium, e.g. water, drives out (see arrow) the synthetic material which is—under "smart temperature control" by its mould 4—still liquid or viscous, thus forming conduit 15. In step 9b a basic conductive layer 16 is be made by feeding the relevant fluids or gases through the conduit 15. Optionally, the conductive layer is reinforced by electroplating in step 9c, resulting in a current conductor 17.

FIGS. 10a-d illustrate in the same way the main steps for making an electrical conductor using foam injection. Step 10a is equal to step 9a. In step 10b the conduit 15 is filled with an open foam 18. In step 10c a basic conductive structure in the foam 18 is be made by feeding the relevant fluids or gases through the foam 18 in conduit 15. Optionally, in step 10d the conductive layer is reinforced by electroplating the "foamy" conductive structure within the conduit 15, resulting in a current conductor 19.

FIG. 11a-d illustrate very schematically the main steps for making an electrical conductor using an auxiliary carrier 20, which may or may not have been made in the same mould 4 in an earlier process step, which will not be discussed here as it is deemed to be within the capabilities of persons well-skilled in the art of the manufacturing of synthetic products by means of more or less complex moulds e.g. having movable mould cores etc. In step 11b a basic conductive structure 21 is applied upon the outside surface of the carrier 20 by feeding the relevant fluids or gases through conduit 15, along carrier 20. In step 11c the conductive layer is reinforced by electroplating the conductive layer upon carrier 20, resulting in a conductor 22. When, in step b, not only the outer surface of the carrier 20, but also the inner surface of the conduit 15 is provided with a conductive layer, similar to step 9b, in step 11c not only the layer 21 upon the auxiliary layer 20 will "grow" by electroplating, but also the layer upon the inner surface of the conduit, as illustrated in FIG. 9c. The result of this all is that both the outer layer on the carrier 20 and the inner layer within the conduit will grow, as a result of which the entire free space of the conduit can be filled with conductive material, thus forming a conductor 23 which is capable to carry rather large electrical currents (e.g. 100 Amps). Instead, the conduit may be made by foam injection, the open structure of which being made conductive as outlined above.

Furthermore, it should be appreciated that not only conduits 15 as shown in FIG. 6 can be made conductive using the methods described above but also cavities 3 as shown in FIG. 1.

The invention claimed is:

1. A method of making a product having a solid body and having one or more cavities inside that solid body, comprising the steps of:
   providing a liquid material within a mould, the mould having an interior surface;
   controlling a factor that determines solidifying speed of said liquid material, the factor being controlled as a function of position along the interior surface, the solidifying speed being made lower adjacent said intended one or more cavities;
   driving out the liquid material within said intended one or more cavities, when said liquid material has solidified adjacent said intended one or more cavities but not yet in said one or more cavities; and
   wherein said factor is temperature of the interior surface, the method comprising controlling the temperature of the interior surface as a function of position along the interior surface such that the solidifying speed is slower adjacent one or more cavities, the slower solidifying speed being achieved by a temperature control structure having a localized widening shape at a position corresponding to at least one of the one or more cavities.

2. The method according to claim 1, wherein said interior surface is a surface of a wall of said mould, the method comprising:
   providing the temperature control structure in the form of a conduit in said wall, the conduit having a localized widening shape locally at a position corresponding to at least one of one or more cavities;
   circulating a fluid through said conduit before driving out the liquid material, the fluid having a temperature that differs from a temperature that applies in said wall outside a region where said conduit is provided.

3. The method according to claim 2, comprising:
   circulating a further fluid through said wall outside a region where said conduit is provided, the temperatures of the fluid and the further fluid being controlled at mutually different temperature values.

4. The method according to claim 1, wherein said material is a thermoplastic material which is liquid above its melting point, the method comprising cooling a wall of the mould to a different degree as a function of position, the wall being cooled relatively less in a region or regions adjacent said intended one or more cavities and relatively more outside said region or regions.

5. The method according to claim 1, wherein said material is a thermosetting material which is liquid before curing, the method comprising heating a wall of the mould to a different degree as a function of position, the wall being heated relatively less in a region or regions adjacent said intended one or more cavities and relatively more outside said region or regions.

6. The method according to claim 1, the liquid material within said intended one or more cavities is driven out by applying a fluid at positions of inlets to said intended one or more cavities.

7. The method according to claim 1, wherein the mould only has flat planar interior surfaces.

8. The method according to claim 1, further comprising an additional step of applying a conductive structure inside at least part of the intended one or more cavities.

9. The method according to claim 8, comprising a step of feeding a medium or a sequence of mediums through each relevant cavity capable of supplying the conductive structure or at least to supply a basis for the conductive structure inside the cavity.

10. The method according to claim 8, comprising steps of:
    supplying an open foam structure inside each relevant cavity;
    feeding a medium or a sequence of mediums into the cavity containing the foam structure, capable to supply the desired conductive structure or at least to supply a basis for that conductive structure in that foam structure.

11. The method according to claim 8, comprising steps of:
    providing a carrier body inside each relevant cavity;
    feeding a medium or a sequence of mediums into the cavity containing the carrier body, capable to supply the desired conductive structure or at least to supply a basis for that conductive structure upon the surface of the carrier.

12. The method according to claim 8, further comprising a step of electroplating the conductive structure or basis for that conductive structure respectively.

13. The method of claim 1 further comprising the step of releasing the product having a solid body and having one or more cavities inside that solid body from the mould.

14. The method according to claim 13, wherein the product is a one-piece body comprising at least one internal room which is communicatively connected to one or more openings in the one-piece body's outer surface via conduits that are narrower than said at least one internal room.

15. The method according to claim 14, wherein one or more of said at least one internal room or conduit comprises a conductive layer or structure.

16. The method according to claim 15, wherein the conductive structure comprises a foam structure.

17. The method according to claim 15, further comprising the step of applying the conductive layer upon the surface of an auxiliary carrier within the relevant internal room or conduit.

18. The method of claim 1 wherein, during the driving out the liquid material step, driving out occurs when said liquid material has solidified through the body from a first exterior face of the product on the interior surface to a second exterior face of the product opposite said first exterior face adjacent said intended one or more cavities but not yet in said one or more cavities.

19. A system for manufacturing a product having a solid body and having one or more cavities inside that solid body, the system comprising:
    a mould for forming a product, the mould having a wall;
    a temperature control structure for controlling a temperature of an interior surface of the mould that determines solidifying speed of liquid material adjacent the wall, the temperature of the interior surface being controlled as a function of position along a surface of said wall such that outlines of the one or more cavities are defined, the temperature control structure having a localized widening shape at a position corresponding to the one or more cavities; and a driving unit coupled to the mould for applying a fluid to material in the mould selectively at one or more positions located to drive out the liquid material within said one or more cavities;

wherein controlling the temperature of the interior surface as a function of position along the wall is such that the solidifying speed is slower adjacent one or more cavities.

20. The system according to claim 19, comprising:

the temperature control structure in the form of a conduit in said wall, the conduit localized widening shape at a position corresponding to at least one of one or more cavities;

a temperature controlled fluid circulation unit coupled to the conduit for circulating a fluid through said conduit, the fluid having a temperature that differs from a temperature that applies in said wall outside a region where said conduit is provided.

21. The system according to claim 20, comprising: a further temperature controlled fluid circulation unit coupled to the mould for circulating a further fluid through said wall outside a region where said conduit is provided, the temperatures of the fluid and the further fluid being controllable at mutually different temperature values.

22. The system of claim 19 wherein the driving unit drives out the liquid material within said one or more cavities when said liquid material has solidified through the body from a first exterior face of the product on the interior surface to a second exterior face of the product opposite said first exterior face adjacent said intended one or more cavities but not yet in said one or more cavities.

23. A mould for manufacturing a product having a solid body and having one or more rooms inside that solid body, the mould having an interior surface, the mould comprising:

means to support position dependent control of a factor that determines solidifying speed of a material in the mould, the factor being controllable as a function of position along the interior surface;

at least one inlet and outlet for passing a fluid to drive out the material, the at least one inlet and outlet being located at positions defined by said means, where said means provide for locally reduced solidifying speed; and wherein said factor is temperature of the interior surface, the mould being configured to permit controlling the temperature of the interior surface as a function of position along the interior surface such that the solidifying speed is slower adjacent one or more cavities, the slower solidifying speed being achieved by a temperature control structure having a localized widening shape at a position corresponding to at least one of the one or more cavities.

24. The mould according to claim 23, wherein said interior surface is a surface of a wall of said mould, the mould comprising:

the temperature control structure in the form of a fluid circulation conduit in said wall, the conduit having a localized widening shape at a position corresponding to at least one of one or more cavities.

25. The mould according to claim 24, comprising:

a fluid circulation circuit through said wall outside a region where said fluid circulation conduit is provided, the fluid circulation conduit and the fluid circulation circuit being configured to receive fluids separately from each other.

26. The mould according to claim 23, further comprising a radiation mask for providing position dependent modulation of UV irradiation through the interior surface.

27. The mould according to claim 23, wherein the mould only has flat planar interior surfaces.

* * * * *